United States Patent [19]

Tateishi et al.

[11] 4,384,334
[45] May 17, 1983

[54] APPARATUS FOR DRIVING PULSE MOTORS FOR AUTOMATICALLY ADJUSTING EXTERNAL CIRCUITS

[75] Inventors: Kazushi Tateishi, Kamisatomachi; Kuniaki Anzai, Kumagaya; Taketoshi Tomita, Chichibu, all of Japan

[73] Assignee: Tokyo Shibaura Denki Kabushiki Kaisha, Kawasaki, Japan

[21] Appl. No.: 224,310

[22] PCT Filed: Jun. 30, 1979

[86] PCT No.: PCT/JP79/00172

§ 371 Date: Nov. 5, 1980

§ 102(e) Date: Nov. 5, 1980

[87] PCT Pub. No.: WO80/02492

PCT Pub. Date: Nov. 13, 1980

[30] Foreign Application Priority Data

| May 8, 1979 | [JP] | Japan | 54-55851 |
| May 8, 1979 | [JP] | Japan | 54-55852 |
| May 8, 1979 | [JP] | Japan | 54-55853 |
| May 8, 1979 | [JP] | Japan | 54-55854 |
| May 8, 1979 | [JP] | Japan | 54-55855 |
| May 8, 1979 | [JP] | Japan | 54-55856 |
| May 11, 1979 | [JP] | Japan | 54-57817 |
| May 11, 1979 | [JP] | Japan | 54-57818 |
| May 11, 1979 | [JP] | Japan | 54-57821 |

[51] Int. Cl.³ ............... G05B 11/32; H05K 13/00; H04N 7/02; H02P 8/00
[52] U.S. Cl. ............... 364/481; 318/573; 318/603; 324/73 AT
[58] Field of Search ............... 364/481; 324/73 AT, 324/73 PL, 158 F, 158 R, 158 MG; 318/573, 603

[56] References Cited

U.S. PATENT DOCUMENTS

| 3,416,054 | 12/1968 | Galles . | |
| 4,092,593 | 5/1978 | Wolk | 324/73 PC X |
| 4,112,364 | 9/1978 | Katz | 324/73 PC X |
| 4,150,328 | 4/1979 | Cannon . | |
| 4,168,527 | 9/1979 | Winkler | 364/579 X |
| 4,204,155 | 5/1980 | Terry | 324/158 F |
| 4,267,507 | 5/1981 | Guerpont | 324/73 PC X |
| 4,270,178 | 5/1981 | Lillig | 364/481 X |
| 4,277,831 | 7/1981 | Saunders et al. | 364/481 |
| 4,320,339 | 3/1982 | Vancelette | 324/158 F X |
| 4,321,533 | 3/1982 | Matrone | 324/73 PC X |

FOREIGN PATENT DOCUMENTS 1128034 10/1965 United Kingdom .
1502825 4/1975 United Kingdom .

Primary Examiner—Edward J. Wise
Attorney, Agent, or Firm—Cushman, Darby & Cushman

[57] ABSTRACT

A plurality of pulse motors (225X, 225Y, 225Z) can rotate driver devices (222X, 222Y, 222Z). The driver devices are fitted in the parts of, for example, a horizontal oscillation circuit, a vertical output circuit and a power source circuit of a television circuit, which are formed on a printed circuit board (220). The outputs of the horizontal oscillation circuit, vertical output circuit and power source circuit are supplied to a digital frequency counter (223X), a first digital voltmeter (223Y) for measuring vertical amplitude and a second digital voltmeter (223Z) for measuring power source voltage, respectively. They are converted into digital data.

The output data of the digital frequency counter (223X), the first digital voltmeter (223Y) and the second digital voltmeter (223Z) are compared with predetermined data at digital comparators (224X, 224Y, 224Z), respectively. The digital comparators (224X, 224Y, 224Z) can produce signals for changing the direction of rotation of the corresponding pulse motors or signals for stopping the corresponding pulse motors, in accordance with the results of comparison of the input data and the predetermined data. When the outputs of all the digital comparators are signals for stopping the pulse motors, the supply of drive pulses to the pulse motors is stopped by a logic circuit (230).

5 Claims, 11 Drawing Figures

APPARATUS FOR DRIVING PULSE MOTORS FOR AUTOMATICALLY ADJUSTING EXTERNAL CIRCUITS

TECHNICAL FIELD

This invention relates to an apparatus which effectively drives pulse motors for an automatic testing apparatus for testing printed circuit boards of television receivers at a series of checking and adjusting steps.

BACKGROUND ART

On a printed circuit board of a television receiver there are constituted various circuit blocks such as a reception circuit block and a deflection circuit block. This is made possible because parts have been successfully miniaturized. If such a printed circuit board is manually tested, it will be erroneously checked or erroneously adjusted on many occasions, and the testing procedures will take a considerable time. An automatic testing apparatus is therefore demanded.

DISCLOSURE OF INVENTION

This invention provides an apparatus for driving pulse motors for automatically adjusting external circuits, comprising:

plurality of rotation direction switching xircuits each having a first control terminal and a second control terminal;

pulse motor means including a plurality of pulse motors connected to the respective rotation direction switching circuits and a plurality of driven devices connected to the respective pulse motors for adjusting said external circuits, each said pulse motor rotating; in one direction when a control signal is supplied to the first control terminal of the corresponding rotation direction switching circuit and rotating in the reverse direction when a control signal is supplied to the second control terminal of the corresponding rotation direction switching circuit;

measuring means adapted to be connected to the external circuits; for measuring the outputs of parts of circuits a plurality of digital comparators comparators connected to the measuring means for comparing output data of the measuring means with predetermined data and for delivering logic outputs through first output terminals thereon, when the output data of the measuring means is greater than the predetermined data, through second output terminals thereof when the output data of the measuring means is smaller than the predetermined data, and through third output terminals thereof when the output data of the measuring means is substantially equal to the predetermined data, the first output terminals connected to the respective first control terminals and the second output terminals connected to the respective second control terminals;

pulse generating circuit for generating drive pulses to drive the pulse motors;

gate circuit means connected to the pulse generating circuit and the digital comparators for individually inhibiting the drive pulses from being supplied to the pulse motors when receiving predetermined logic outputs from the third output terminals and control circuit means connected to the gate circuit means for outputting a stop signal when receiving the predetermined logic outputs from the third output terminals so as to turn off the gate circuit means, whereby automatic adjustment of the external circuits is stopped, whereby the parts of a plurality of circuits which electrically interdepend are adjusted at the same time, and the adjusting operation is stopped when the outputs of all the circuits come to have desired characteristics at the same time.

BEST MODES OF CARRYING OUT THE INVENTION

Now embodiments of this invention will be described in detail with reference to the accompanying drawings.

Figure 1:
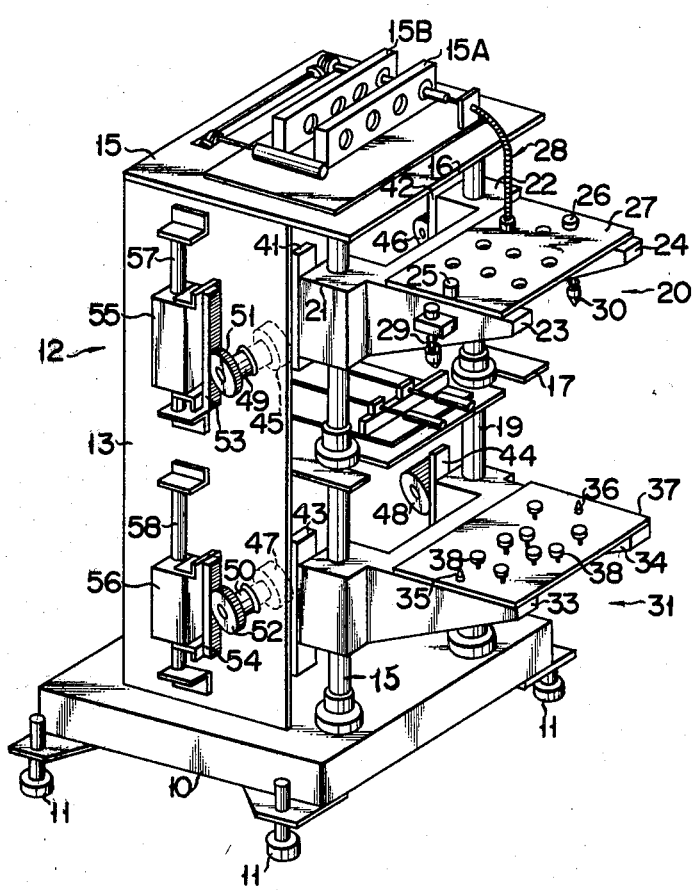
FIG. 1 is a perspective view of an automatic part testing and adjusting apparatus.
Figure 2:
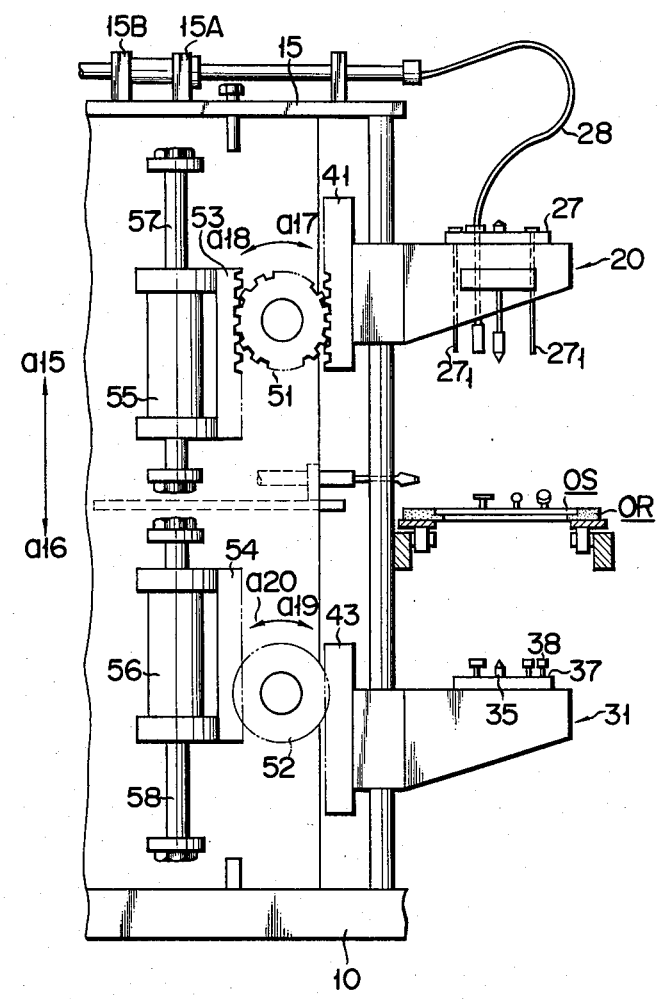
FIG. 2 is a side view of the automatic part testing and adjusting apparatus shown in FIG. 1.

First, referring to FIGS. 1 and 2, there will be described an automatic apparatus for testing and adjusting parts, to which a pulse motor driving apparatus of this invention is applied. In FIGS. 1 and 2, numeral 10 denotes a base. The base 10 has at several positions adjusting members 11 which serve to adjust the leveling and elevation of the base 10. On the base 10 an apparatus housing 12 is secured. The housing 12 comprises two side plates 12 and 14 (the plate 14 not shown) which vertically stand on the base 10 and which are parallel to each other, a top plate 15 which bridges the side plates 13 and 14, and a support plate 17 which is disposed between the top plate 15 and the base 10 and which is parallel to the base 10.

A first guide shaft 18 and a second guide shaft 19 are secured at one end to the base 10 and at the other end to the top plate 15 near the edge 16 thereof. They extend vertically and are parallel to each other. On the first guide shaft 18 and the second guide shaft 19 an upper arm table 20 is movably mounted and extending in the horizontal direction. The arm table 20 is substantially H-shaped, for example, as viewed from above. It comprises a pair of legs 21 and 22 having holes through which the first guide shaft 18 and the second guide shaft 19 extend, respectively, thereby supporting the arm table 20 horizontally. The arm table 20 further comprises a pair of arms 23 and 24 which extend from the front of the housing 12. A pallet 27 constituted by a transparent synthetic resin plate is secured to the arms 23 and 24 by means of screws 25 and 26. The pallet 27 has a plurality of through holes. A driver device 28 for adjusting parts may be inserted into any one of these through holes and may extend downward. It may be secured to the pallet 27 by means of a screw or the like. On the lateral sides of the arms 23 and 24 there are provided positioning pins 29 and 30 which extend downward so as to accurately position a printed circuit board which is placed below the arm table 20. The positioning pins 29 and 30 have each a conical head which is biased downward by, for example, a coil spring.

On the first guide shaft 18 and the second guide shaft 19 a lower arm table 31 is movably mounted in the same way as the upper arm table 20. The lower arm table 31 comprises a pair of arms 33 and 34 to which a pallet 37 constituted by a transparent synthetic resin plate is secured by means of screws 35 and 36. The pallet 37 has also a plurality of through holes. Contact pins 38 which are used when parts are checked may be screwed into any desired through holes. Thus, the contact pins 38 may protrude upward.

Racks 41 and 42 are secured to the legs 21 and 22 of the upper arm table 20, respectively, and racks 43 and 44 to the legs of the lower arm table 31, respectively. These racks 41 to 44 extend parallel to the guide shafts 18 and 19. Four pinions 45, 46, 47 and 48 are put in engagement with the racks 41, 42, 43 and 44, respectively. As the pinions are rotated, the arm tables 20 and 31 are moved up and down, toward each other or away from each other.

The pinions 45, 46, 47 and 48 are fixed each to one end of a shaft which penetrates the side plate 13 or 14 of the housing 12. The pinions 45 and 47, for example, are fixed to shafts 49 and 50, respectively as illustrated in FIG. 1. The shafts 49 and 50 are secured to pinions 51 and 52, respectively, which are provided outside the housing and close to the side plate 13. The pinions 51 and 52 are put in engagement with racks 53 and 54. These racks 53 and 54 are attached to double acting type air cylinders 55 and 56. The rod 57 of the cylinder 55 and the rod 58 of the cylinder 56 are secured at both ends to support members which protrude from the side plate 13. As a result, the casings of the air cylinders 55 and 56 can be moved up and down, whereby the racks 53 and 54 rotate the pinions 51 and 52, respectively.

Constructed as described above, the automatic apparatus for checking and adjusting parts operates as now will be described. As the upper air cylinder 55 is moved in the direction of arrow a15 in FIG. 2, the rack 53 rotates the pinion 51 and the pinion 45 in the direction of arrow a17. At the same time the upper arm table 20 moves downward in the direction of arrow a16 until rods $27_1$ attached to the pallet 27 come in touch with a printed circuit board OS which is supported by a board pallet OR. The board OS is so positioned that the rods $27_1$ touch a portion of the board OS which lies between the parts formed on the board OS.

Then, the lower air cylinder 56 is moved in the direction of arrow a16, thus rotating the pinions 52 and 47 in the direction of arrow a20 and thus moving the lower arm table 31 upward in the direction of arrow a15. The arm table 31 is moved up until the contact pins 38 come into contact with those terminals of desired parts which are to be soldered. The contact pins 38 are provided each with a cushion mechanism and thus movable in the direction of either arrow a15 or a16. All the contact pins 38 can therefore contact the terminals, no matter whether the terminals have different lengths. The driver device is so moved as to have its end brought into contact with a desired part. With the contact pins 38 put in touch with the terminals, the parts are checked, tested and adjusted automatically. During the test, an automatic gain control may be detected by supplying a predetermined reference signal to the input section of, for example, an intermediate frequency circuit. Or it may be detected whether or not a predetermined output is produced, by changing the level of the reference signals to various degrees. If necessary, the driver device is automatically rotated to adjust the circuits. The testing and adjusting procedures are carried out by a microcomputer. Once these procedures, which are achieved by mechanical system, have been completed, the air cylinders and the pinions are brought back to the initial states, and the arm tables are brought back to the respective initial positions. Thereafter another printed circuit board will be checked, tested and adjusted. Other driver devices are attached to the support plate 17. These driver devices may be moved horizontally and be operated to adjust the parts formed on a printed circuit board.

The driver devices have such a structure as will now be described.

Figure 3:
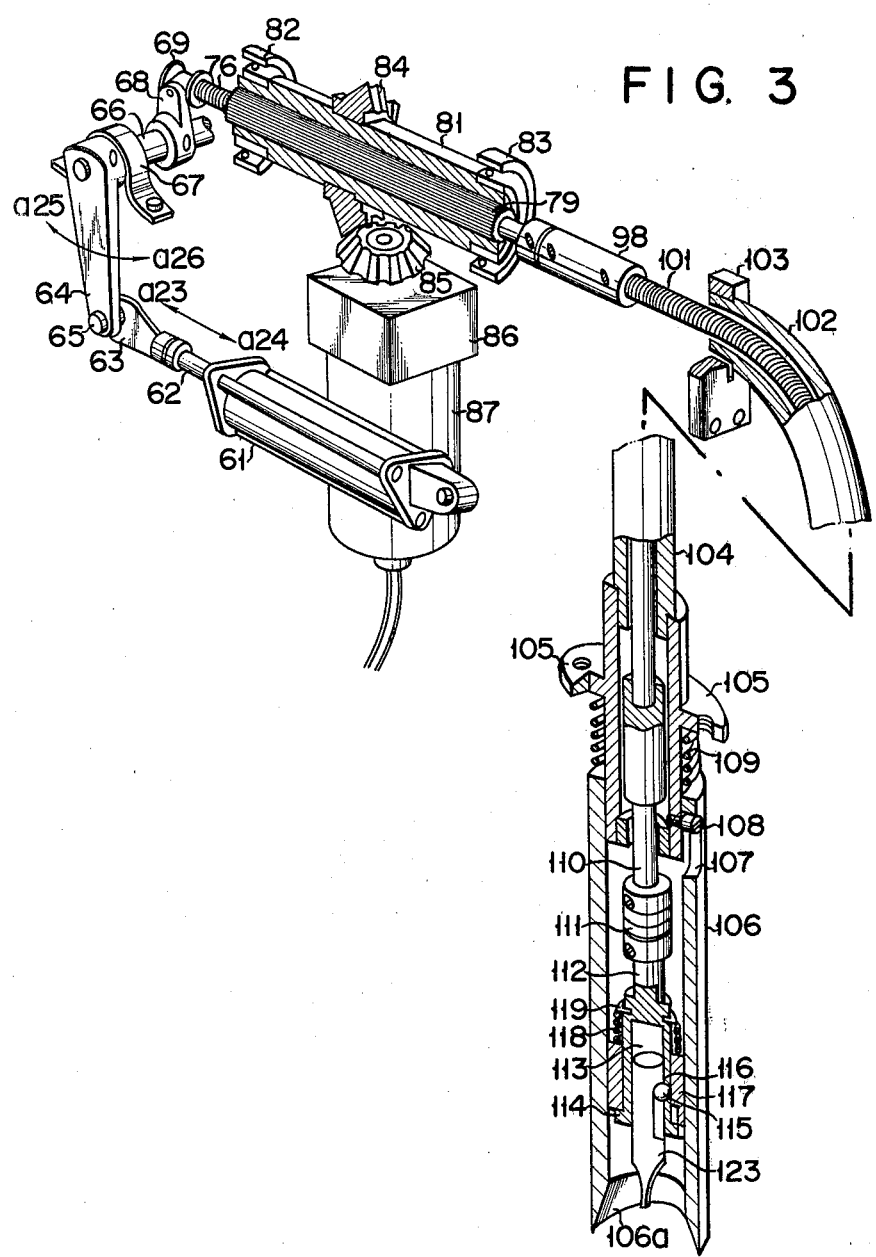
FIG. 3 shows the structure of an Example of a driver device.

In FIG. 3, numeral 61 denotes an air cylinder. The air cylinder 61 is secured to, for example, the lower surface of the top plate of the above-described automatic apparatus for testing and adjusting parts. A piston rod 62 of the air cylinder 61 is connected to one end of a cam 64 via a universal joint 63 and by means of a pin 65. The proximal end portion of the cam 64 protrudes upward through an opening of the top plate and is secured to one end of a shaft 66. The shaft 66 is rotatably supported at its middle portion by a bearing 67. The bearing 67 is secured on the upper surface of the top plate by means of screws or the like. To the other end of the shaft 66 a cam 68 is secured at its proximal end portion so that it swings when the shaft 66 is rotated. The proximal end portion of the cam 68 extends upward and is put in a groove of a grooved collar 69.

The members described in the preceding paragraph constitute means for moving a tip (hereinafter described) in the axial direction of the driver device. As the piston rod 62 of the air cylinder 61 is moved in the direction of arrow a23 or a24 in FIG. 3, the cam 64 swings about the shaft 66 in the direction of arrow a25 or a26. At the same time the cam 68 rocks in the direction of arrow a25 or a26, whereby the grooved collar 69 is moved in the axial direction of the driver device.

Figure 4:
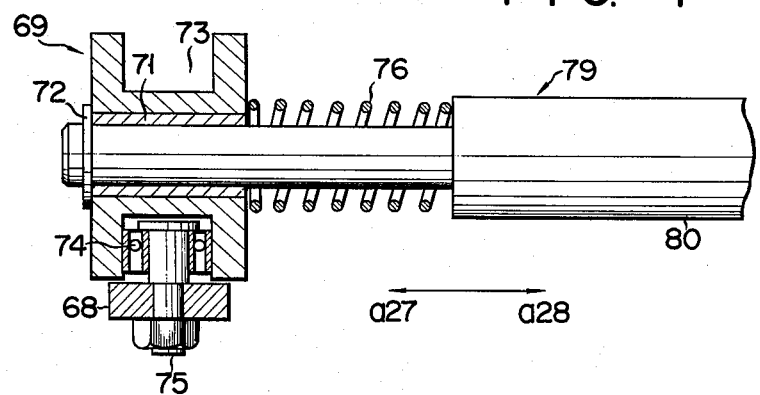
FIG. 4 shows the structure of drive means for moving the driver device of FIG. 3 in the axial direction.

The grooved collar 69 is connected coaxially to one end of a spline shaft 79. More specifically, as shown in FIG. 4, the end portion of the spline shaft 79 is rotatably inserted in a bushing 71 which is inserted in the grooved collar 69. A stop ring 72 is secured to the end of the shaft 79 to prevent the grooved collar 69 from moving in one axial direction of the shaft 79. A compression coil spring 76 is wound about the end portion of the spline shaft 79 and lies between the grooved collar 69 and the thicker portion 80 of the spline shaft 79. The spring 76 urges the grooved collar 69 to move in the direction of arrow a27. In the groove 73 of the collar 69 there is fitted a ball bearing 74 which is attached to the cam 68 by a pin 75. The grooved collar 69 is therefore permitted to rotate and to move in the direction of arrow a28. When the grooved collar 69 is moved in the direction of arrow a28, the compression spring 76 exerts force on the spline shaft 79 in the axial direction thereof. If the spline shaft 79 does not move by force acting in the direction of arrow a28, the compression spring 76 contracts to absorb the displacement of the grooved collar 69.

In the outer periphery of the thick portion 80 (or middle portion) of the spline shaft 79 there are cut a number of grooves which extend parallel to one another and in the axial direction of the spline shaft 79. The thick portion 80 of the spline shaft 79 is inserted in a spline metal 81 as illustrated in FIG. 3. The spline metal 81 is a hollow cylinder and has a number of grooves which are cut in its inner periphery and which correspond to the grooves of the thick portion of the spline shaft 79. The spline metal 81 therefore does not move when the spline shaft 79 moves in the axial direction, but it rotates when the spline shaft 79 rotates.

The ends of the spline metal 81 are supported by bearings 82 and 83, respectively so that the spline metal 81 may rotate. The bearings 82 and 83 are secured respectively to support plates 15B and 15A which are, as shown in FIG. 2, fixed to the top plates of the automatic apparatus for testing parts. The spline metal 81 is therefore rotatable. To the middle portion of the spline metal 81 a bevel gear 84 is secured coaxially. The bevel gear 84 is meshed with another bevel gear 85 which is secured to the shaft of a decelerator 86. The decelerator 86 is driven by a motor 87 and reduces the speed of rotation of the motor 87. The decelerator 86 and the motor 87 are attached to the lower surface of the top plate, with the shaft of the decelerator 86 extending through an opening of the top plate and the bevel gear 85 positioning above the top plate. The rotation of the motor 87 is transmitted to the decelerator 86, the bevel gear 85, the bevel gear 84, the spline metal 81, and finally the spline shaft 79. These members constitute means for rotating the tip of the driver device.

The other end of the spline shaft 79, which is the output member of the means for rotating the tip, is coupled to clutch means. More specifically, it is inserted in a boss 88 and firmly secured to the boss 88 by a set screw 89.

Figure 5:
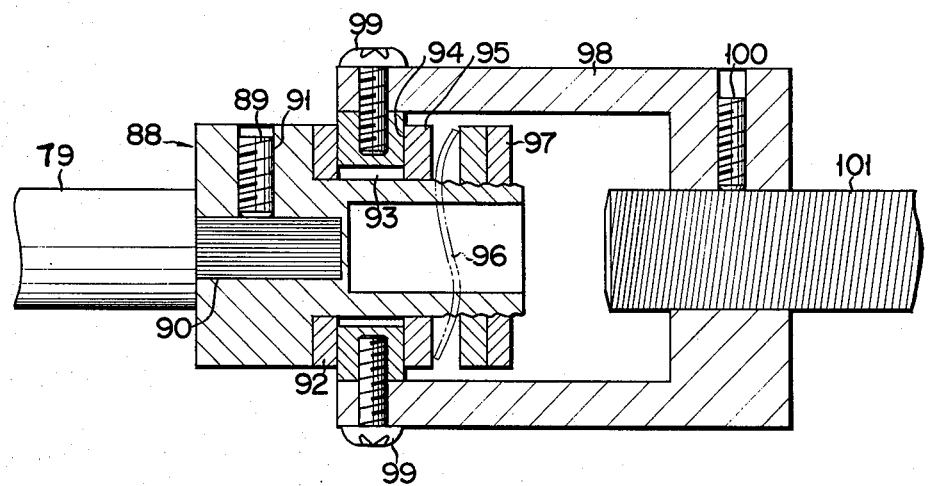
FIG. 5 shows an example of clutch means of the driver device shown in FIG. 3.

As shown in FIG. 5, the boss 88 has in one end portion a hole 90 for receiving the other end of the spline shaft 79 and a screw hole 91 to mesh with the set screw 89 which is to firmly secure the shaft 79 to the boss 88. The boss 88 has a thin portion which is a hollow cylinder and which makes the other end portion of the boss 88. A screw is cut in the outer periphery of the thin portion of the boss 88. On the thin portion, a ring washer 92, a ring 94 having a bush 93 on the inner periphery, and a washer 95 are loosely mounted. A waving ring spring 96 is loosely mounted on the thin portion to push the washers 92 and 95 and the ring 94 toward the thick portion of the boss. A so-called double nut 97 is meshed with the screw cut in the outer periphery of the thin portion. These members 88, 92, 94, 95, 96 and 97 constitute a clutch.

The ring 94 is fitted in an opening of a clutch case 98 which is coaxial with the ring 94 and which is a hollow cylinder with end closed. The clutch case 98 is secured to the ring 94 by means of screws 99. The closed end of the clutch case 98 has a center hole, in which one end of a flexible shaft 101 is inserted. The shaft 101 is fixed to the case 98 by a set screw 100. The clutch means therefore transmits the rotation of the spline shaft 79 to the boss 88. The ring 94 and the clutch case 98 can rotate jointly with the boss 88 thereby to rotate the flexible shaft 101. If a large load is applied on the flexible shaft 101, the bush 93 and the boss 88 slip on each other, whereby the flexible shaft 101 is not be forcedly rotated. The minimum load that would make the bush 93 and the boss 88 slip is adjusted by turning the double nut 97 and/or the coefficients of friction of the bush 93 and the washers 92 and 95. The output of the clutch means is transmitted to the flexible shaft 101.

As illustrated in FIG. 3, the flexible shaft 101 is inserted in a flexible tube 102 made of a synthetic resin. One end of the tube 102 is held by a tube holder 103 which is secured to the upper surface of the top plate. The other end of the tube 102, which extends from the tube holder 103, is fixed coaxially to one end of a driver cylinder 104. The driver cylinder 104 has a flange-like wing 105 on its outer periphery. The wing 105 has screw holes and can thus be secured firmly to the pallet 27. The other end (i.e. distal end) of the driver cylinder 104 is inserted in one end portion of a transparent guide cylinder 106. The guide cylinder 106 has two or three slit holes 107 in said one end portion, which extend in the axial direction of the guide cylinder 106. Through these slit holes 107 pins 108 are engaged in screw holes of the driver cylinder 104. Between the end of the guide cylinder 106 and the wing 105 of the driver cylinder 104 a compression coil spring 109 is interposed. The guide 106 is thus urged to move away from the driver cylinder 104. Normally the guide cylinder 106 remains is such position that the pins 108 contact the upper ends of the slit holes 107. When pushed upward, the guide cylinder 106 can be resiliently displaced toward the driver cylinder 104 for a distance corresponding to the length of the slit holes 107. The pin 108, the slit holes 107, the compression spring 109 constitute a cushion means for the guide cylinder 106.

The distal end of the flexible shaft 101 is connected to one end of a connection rod 110 which can slide like a piston in the driver cylinder 104. The other end portion of the connection rod 110 extends through a bearing of the driver cylinder 104 and is connected to one end of a flexible coupler 111. The flexible coupler 111 comprises, for example, a coil spring made of a strip. The other end of the coupler 111 is connected coaxially to a tip holding rod 112. The tip holding rod 112 has in its distal end portion a coaxial hole 113 for receiving a tip. A flange-like stopper 114 is integrally formed with the distal end of the rod 112. The rod 112 has a hole 116 in the vicinity of the stopper 114. The hole 116 communicates with the coaxial hole 113 and is large enough to let a steel ball 115 to pass.

The tip holding rod 112 is inserted in a hollow cylinder 117 to prevent the steel ball 115 from coming out of the hole 116 of the rod 112. One end of the cylinder 117 contacts the stopper 114. The other end of the cylinder 117 is urged by a compression spring 118 in such a manner that the cylinder 117 is pushed onto the stopper 114. The compression spring 118 urges the cylinder 117 at one end and is stopped at the other end by a stop ring 119 attached to the outer periphery of the tip holding rod 112. The cylinder 117 has a larger inner diameter at the end portion which contacts the stopper 114. In other words, this end portion of the cylinder 117 is made thinner than the other portion, thus providing a space 120 into which the steel ball 115 may fall. The cylinder 117 and the compression spring 118 constitute means for exchanging tips.

Figure 6:
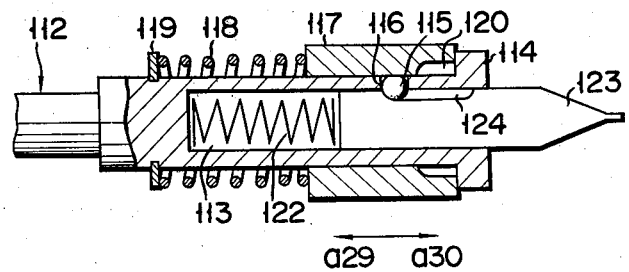
FIG. 6 shows an example of a tip replacement section of the driver device shown in FIG. 3.

Now referring to FIG. 6, the tip exchanging means will be described in detail. In the coaxial hole 113 of the tip holding rod 112 a coil spring 122 is inserted. A tip 123 is inserted in the hole 113 in such a manner to compress the spring 122. A groove 124 of a proper length is cut in the outer periphery of that portion of the tip 123 which is inserted in the hole 113. The steel ball 115 is received partly in this groove 124 and partly in the hole 116 of the tip holding rod 112. The length of the cylinder 117 and the position of the groove 124 are so determined that the steel ball 115 is pushed onto the inner periphery of the thin portion of the cylinder 117 so long as the cylinder 117 is urged by the compression spring 118 and is stopped by the stopper 114.

The tip exchanging means being so constituted, the steel ball 115 can slip into the space 120 of the cylinder 117 if the cylinder 117 is pushed in the direction of arrow a29 against the force of the compression spring 118. This is because the tip 123 is pushed by the spring 122 in the direction of arrow a30, and the end of the groove 124 of the tip 123 urges the steel ball 115 to come out of the hole 116. The tip 123 can therefore be detached from the tip holding rod 112, and a new tip can be attached to the tip holding rod 112.

The tip 123 may be a rod of sapphire, for example, which has a pointed flat end. When it is broken or worn too much, the tip is replaced by a new one. The tip 123 is so attached to the tip holding rod 112 by an engagement means or the hole 113 of the rod 112 and the tip 123 have polygonal sections, so that the rod 112 and the tip 123 rotate together.

The tip holding rod 112, the cylinder 117 and the tip 123 are coaxially aligned in the guide cylinder 106. When the distal end of the tip 123 is inserted in a part which should be adjusted, they may be rotated thereby to adjust the part.

Figure 7:
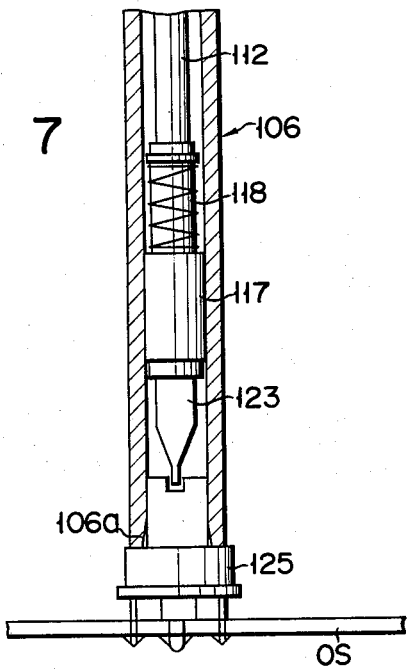
FIG. 7 shows how the distal end portion of the driver device of FIG. 3 is put in engagement with a part to be adjusted.

As shown in FIGS. 3 and 7, the transparent guide cylinder 106 has a tapered inner periphery 106a in its distal end portion. That is, its distal end portion has a gradually increasing inner diameter. The driver device is lowered until the tip 123 is guided by the tapered inner periphery 106a and is inserted into a part 125. Then the tip 123 is rotated to adjust the part 125.

Now there will be described a control circuit which drives the above-described driver device, thereby to adjust the circuits on the printed circuit board.

If a deflection circuit of a color television set is to be adjusted, the following points should be taken into consideration. Now the power consumption of a color television set and the material consumption to manufacture a color television set are more and more reduced. To elevate the efficiency of circuits, the circuits are so designed to operate depending on one another, not independently of one another, thereby to constitute a color television set which consumes less power and less material. In a deflection unit of such a color television set, for example, when the output voltage of the power source circuit is changed by $\Delta_e$ to the rated voltage, the oscillator of the horizontal scanning circuit and the oscillator of the vertical scanning circuit will have their output frequencies varied by $\Delta f_1$ and $\Delta f_2$, respectively because their output frequencies depend on the power source voltage. The variation of the output frequency of the horizontal oscillator changes the duty ratio of the horizontal oscillator. As a result, the output voltage of the vertical output amplifier circuit which is operated by a D. C. voltage obtained by rectifying the output pulses of the oscillator is changed also by $\Delta V$.

In case the values of circuits of different functions depend on one another, they are adjusted usually in the following method. That is, (1) the power source circuit is connected to a pseudo-circuit whose load characteristic is equivalent to that of the power source circuit, thereby adjusting the power source circuit only; (2) the oscillators of the horizontal and vertical scanning circuits are then operated by a standard power source of a predetermined voltage; and (3) the entire deflection unit is operated, thereby adjusting the output of the vertical output amplifier circuit.

The method, wherein the steps (1), (2) and (3) are carried out successively, needs much labor to adjust the values of the individual circuits. Further, the errors of adjusting of the circuits would be added up to be so large an error that the circuits must be adjusted again in some cases.

To eliminate the above-mentioned drawback, this invention employs a method in which (1) the circuits of different functions which are to be adjusted are operated at the same time, and (2) closed loops including mechanical elements driven by pulse motors are operated while the circuits are operated, thus adjusting the individual circuits. With this method it is possible that the circuits of different functions operate, automatically depending on one another. The method can therefore enhance the precision of adjusting operation and reduce the time of adjusting operation owing to simultaneous adjusting of the individual circuits.

Figure 8:
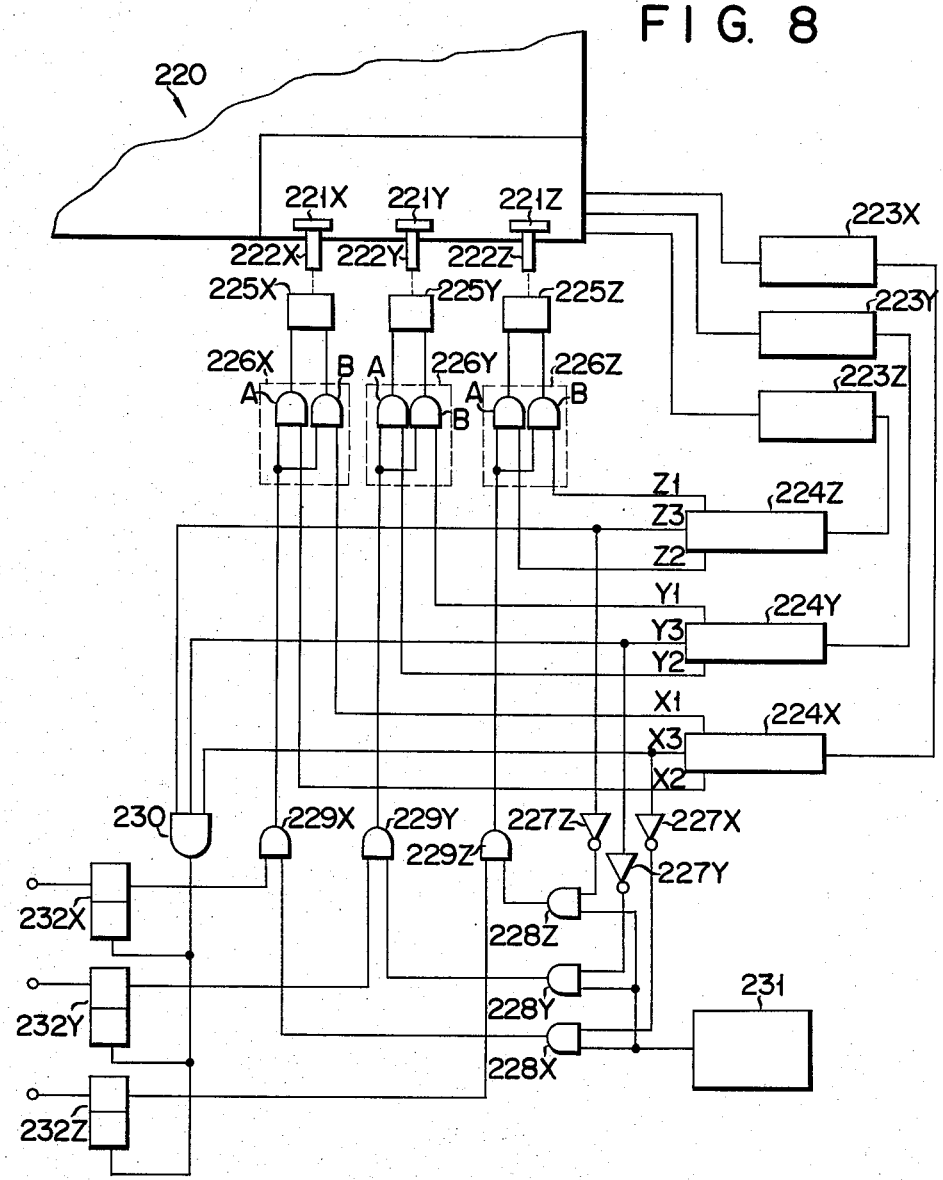
FIG. 8 illustrates the structure of an apparatus for driving the pulse motors of an automatic testing apparatus, an embodiment of this invention.

In FIG. 8, numeral 220 denotes a printed circuit board 220. The printed circuit board 220 is, for example, a large printed circuit board of a color television set. It includes various circuits such as those of a reception system and those of a deflection system.

In the deflection system has variable resistors in, for example, its power source circuit and its output voltage control circuit. Further, it has variable resistors or variable reactances in the frequency adjusting circuits of its horizontal and vertical scanning oscillators. Still further, it has a variable resistor for adjusting its vertical output amplifier circuit. These circuits of different functions depend on one another with respect to two or more values, and one of them, if adjusted, will influence the other circuits.

The driver devices of the apparatus for automatically testing and adjusting parts are brought into engagement with desired parts on the printed circuit board 220, which parts are to be adjusted. In FIG. 8, 221X denotes a part for adjusting horizontal oscillation, 221Y a part for adjusting vertical oscillation, and 221Z a part for adjusting power source voltage. These parts 221X, 221Y and 221Z are to be adjusted by driver devices 222X, 222Y and 222Z, respectively. And the driver devices 222X, 222Y, 222Z are to be rotated by pulse motors 225X, 225Y and 225Z, respectively.

The oscillation output, which is adjusted by the part 221X, is supplied to a digital frequency counter 223X through a contact pin. The vertical amplitude voltage, which is adjusted by the part 221Y, is supplied to a first digital voltmeter 223Y. The power source voltage, which is adjusted by the part 221Z, is supplied to a second digital voltmeter 223Z.

The output data of the digital frequency counter 223X, the first digital voltmeter 223Y and the second digital voltmeter 223Z are supplied to digital comparators 224X, 224Y and 224Z, respectively. The digital comparators 224X, 224Y and 224Z receive prescribed data or reference data from a microcomputer. Each of these comparator generates three types of data, the first data showing that the input data represents a value greater than the upper limit of a reference value, the second data showing that the input data represents a value smaller than the lower limit of the reference value, and the third data showing that the input data is within the range of the reference value. If their input data are greater than the upper limit of the reference values, the digital comparators 224X, 224Y and 224Z deliver logic outputs (high level) through their output terminals X1, Y1 and Z1. If their input data fall within the ranges of the reference values, they deliver logic outputs (high level) through their output terminals X3, Y3 and Z3. If their input data are smaller than the lower limits of the reference values, they deliver logic outputs (high level) through their output terminals X2, Y2 and Z2.

The output terminals X2 ans X1 of the digital comparator 224X are connected one input terminal of a first AND circuit A and one input terminal of a second AND circuit B, respectively, these AND circuits A and B constituting a rotation direction switching circuit 226X for the pulse motor 225X. The output terminals Y2 and Y1 of the digital comparator 224Y are connected to one input terminal of a first AND circuit A and one input terminal of a second AND circuit B, respectively, these AND circuits A and B constituting a rotation direction switching circuit 226Y for the pulse motor 225Y. Similarly, the output terminals Z2 and Z1 of the digital comparator 224Z are connected to one input terminal of a first AND circuit A and one input terminal of a second AND circuit B, respectively, these AND circuits A and B constituting a rotation direction switching circuit 226Z for the pulse motor 225Z. The output terminals X3, Y3 and Z3 of the digital comparators 224X, 224Y and 224Z are connected to first, second and third input terminals of an AND circuit 230. Each of the rotation direction switching circuits includes a motor drive circuit (not shown). The output terminals X3, Y3 and Z3 of the digital comparators 224X, 224Y and 224Z are connected to one input terminal of an AND circuit 228X via an inverter 227X, one input terminal of an AND circuit 228Y via an inverter 227Y and one input terminal of an AND 228Z via an inverter 227Z, respectively, these AND circuits 228X, 228Y and 228Z constituting a first group of AND circuits. The other input terminal of each of these AND circuits 228X, 228Y and 228Z is connected to receive a drive pulse generated by a pulse generating circuit 231. The output terminals of the AND circuits 228X, 228Y and 228Z are connected one input terminal of an AND circuit 229X, one input terminal of an AND circuit 229Y and one input terminal of an AND circuit 229Z, respectively, the AND circuits 229X, 229Y and 229Z constituting a second group of AND circuits. The other input terminals of the AND circuits 229X, 229Y and 229Z are connected to a set output terminal of a flip-flop circuit 232X, a set output terminal of a flip-flop circuit 232Y and a set output terminal of a flip-flop circuit 232Z, respectively. The reset terminals of the flip-flop circuits 232X, 232Y and 232Z are connected to the output terminal of the AND circuit 230. The set input terminals of these flip-flop circuits are connected to receive a control signal which is generated in response to a signal which represents that a printed circuit board is clamped by the above-described device and that the testing and adjusting steps are started.

An apparatus for driving pulse motors of an automatic testing apparatus is constituted as decribed above according to this invention. The apparatus is characterized in particular by the circuit shown in FIG. 8. When a control signal for initiating an adjusting step is supplied to the flip-flop circuits 232X, 232Y and 232Z, the set outputs of the flip-flop circuits render the input level high at one input terminal of each of the AND circuits 229X, 229Y and 229Z. The output frequency and the output voltages which have been adjusted by adjusting the parts 221X, 221Y and 221Z, respectively are supplied to the digital frequency counter 223X, the first digital voltmeter 223Y and the second digital voltmeter 223Z, respectively and detected by them. The output data of the digital frequency counter 223X, the first digital voltmeter 223Y and the second digital voltmeter 223Z are supplied to the digital comparators 224X, 224Y and 224Z, respectively and are compared with the prescribed data. Each digital comparator delivers a signal of high level through its first output terminal if the input data is greater than the prescribed data, and it delivers a signal of high level through its second output terminal if the input data is smaller than the prescribed data. These signals of high level are used to change the direction of rotation of the pulse motor. More specifically, one of the AND circuits A and B of each rotation direction switching circuit is made conductive when the comparator delivers a signal (high level) through its first output terminal. And the other of the AND circuits A and B is made conductive when the comparator delivers a signal (high level) through its second output terminal. To the AND circuit A or B, which as been made conductive, an output pulse of the pulse generating circuit 231 is supplied through the AND circuit 228X or 228Y or 228Z and through the AND circuit 229X or 229Y or 229Z. Consequently, the pulse motors 225X, 225Y and 225Z may be rotated in one direction or the other so as to drive the respective driver devices, thus adjusting the parts 221X, 221Y and 221Z.

When one of the individual circuits is adjusted to a desired degree, and the first digital voltmeter 223Y, for example, detects a desired voltage, the digital comparator 224Y delivers a signal of high level through the third output terminal. The output of the inverter 227Y therefore renders the AND circuit 228Y nonconductive, and the motor 225Y is supplied with no drive pulse from the pulse generating circuit 231. The motor 225Y does not rotate at all. The output of high level delivered through the third output terminal of the digital comparator 224Y is supplied also to the AND circuit 230. The AND circuit 230, however, does not produces a reset pulse to the flip-flop circuits since its other input terminal remains at low level.

When all the parts are adjusted by rotating the driver devices and all the digital comparators 224X, 224Y and 224Z deliver output signals of high level through their third output terminals, the AND circuit 230 produces a reset pulse for the flip-flop circuits 232X, 232Y and 232Z. The signal supplied to one input terminal of each of the AND circuit 229X, 229Y and 229Z from the flip-flop circuit connected to the input terminal of the AND circuit comes to have a low level. As a result, the AND circuits 229X, 229Y and 229Z are rendered nonconductive, a drive pulse is supplied to none of the pulse motors, and none of the pulse motors rotate. This means that all the parts have been adjusted properly.

Any one of the digital comparators 224X, 224Y and 224Z may deliver a signal of high level through its third output terminal while the other comparators deliver a signal of high level through the first or second output terminals. In other words, while two or more values are simultaneously adjusted, the vertical amplitude voltages, for example, may be adjusted to a desired value, while the horizontal oscillation frequency and the power source voltage need to be further adjusted. In this case, the first or second output terminal of the digital comparator 224X remains at high level, and the first or second output terminal of the digital comparator 224Z remains at high level, too. The pulse motors 225X and 225Z which correspond to the digital comparators 224X and 224Z keep on rotating or are rotated in the reverse direction, thus adjusting the parts 221X and 221Z. When the power source voltage, for example, is adjusted to the desired value, the vertical amplitude voltage will occasionally deviate from the desired value since the circuits being adjusted depend upon each other. If this happens, the digital comparator 224Z delivers a signal of high level through the third output terminal, but the other digital comparators 224Y and 224X deliver signals of high level through their first or second output terminals. The motors 225Y and 225X therefore start rotating or keep rotating to adjust the parts 221Y and 221X furthermore.

The loop for adjusting two or more values keeps on working until the outputs of all the circuits being adjusted come to have the desired values at the same time.

Figure 9:
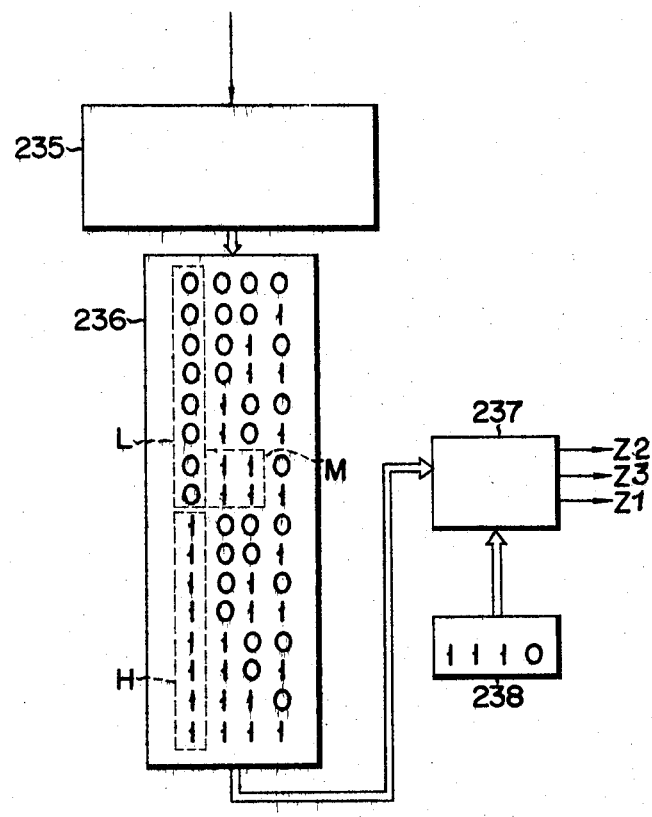
FIG. 9 and FIG. 10 are circuit diagrams of the digital comparator shown in FIG. 8.
Figure 10:
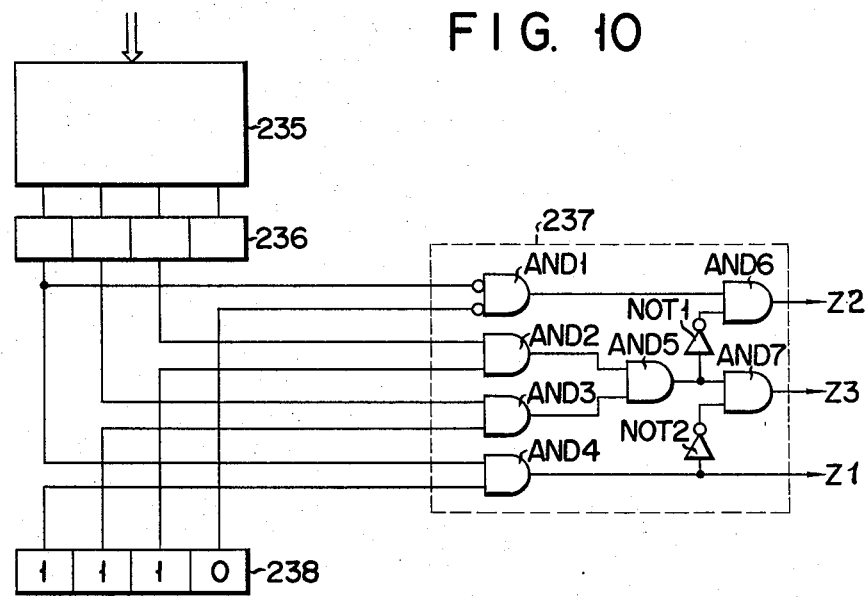

The digital comparators may be constituted as schematically illustrated in FIGS. 9 and 10. In FIGS. 9 and 10, numeral 235 denotes a data converting circuit which decodes, for instance, the output data of the second digital voltmeter 223Z into a numerical data which can easily be handled. The output data of the data converting circuit 235 is supplied to, for example, a 4-bit latch circuit 236. The output data of the latch circuit 236 is compared with the data stored in a prescribed data storage circuit 238 by means of a logic circuit 237. The logic circuit 237 produces an output signal which shows whether the input data is within a range of the prescribed value, greater than the upper limit of the range or smaller than the lower limit of the range. If the most significant digit of the input data of the logic circuit 237 is "0", an AND circuit AND1 of negative logic shown in FIG. 10 judges that the input data of the circuit 237 is smaller than the prescribed value. On the other hand, if the most significant digit of the input data of the logic circuit 237 is "1", an AND circuit AND4 shown in FIG. 10 judges that the input data is greater than the prescribed value. That is, the AND circuit AND1 produces a signal of high level if the input data of the logic circuit 237 belongs to the group encircled by a dotted line L in FIG. 9, and the AND circuit AND4 produces a signal of high level if the input data belongs to the group encircled by a dotted line H in FIG. 9. Further, if the input data of the logic circuit 237 belongs to the group encircled by a dotted line M and thus falls within the range of the predetermined value, AND circuits AND2, AND3 and AND5 shown in FIG. 10 produce an output signal of high level. In the comparator shown in FIG. 10, an inverter NOT1 and an AND circuit AND6 so operate as to determine which AND circuit, AND1 or AND5 should first deliver an output signal when both AND circuits have a high output level. An inverter NOT2 and an AND circuit AND7 so function as to determine which AND circuit, AND2 or AND 5 should first deliver an output signal when both AND circuits have a high output level.

Figure 11:
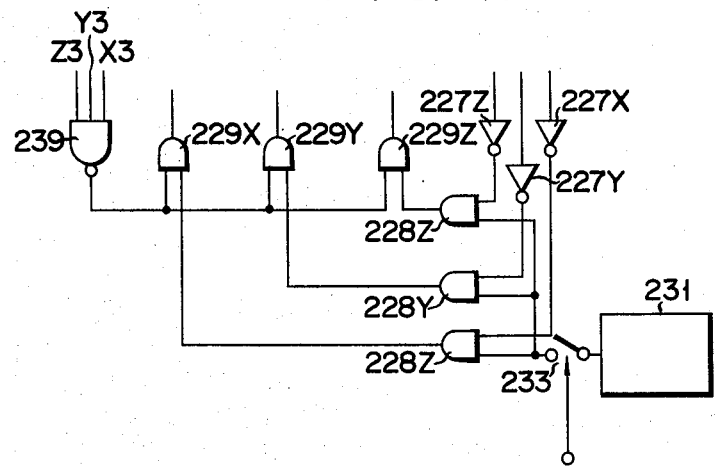
FIG. 11 shows the structure of an apparatus for driving the pulse motors of an automatic testing apparatus, another embodiment of this invention.

In the embodiment of FIG. 8, other various means may be used to utilize the predetermined logic outputs (high level) of the digital comparators 224X, 224Y and 224Z which are delivered through the third output terminals and to obtain a logical product of these predetermined logic outputs. For example, as shown in FIG. 11, an output of an NAND circuit 239 may be used to achieve the gate control of the AND circuits 229X, 229Y and 229Z. Moreover, a signal for initiating adjusting step may be controlled by a switch circuit 233, using the output of the pulse generating circuit 231.

As described above, this invention makes it possible to adjust automatically a plurality of circuits at the same time by simultaneously operating the circuits and by keeping a plurality of adjusting loops closed until the loops fall within the ranges of values stored in storage circuit, though each adjusting loop stops a corresponding pulse motor when its output value falls within the range of the value stored in the corresponding storage circuit.

The invention is therefore effective, particularly in adjusting a plurality of circuits of different functions which depend on one another. It makes it possible to adjust all the circuits in a short time. The above-mentioned embodiment is so designed as to automatically adjust various circuits on a printed circuit board of a color television receiver, more specifically a vertical amplitude voltage, a horizontal oscillation frequency and a power source voltage. But the application of the invention is not limited to a color television receiver; it may apply to any electric circuits in which a plurality of parts need to be adjusted. If the apparatus according to this invention is used to adjust the FM frequency and FM deviation of, for example, a cassette video tape recorder which depend on each other, both the FM frequency and the FM deviation can be adjusted in a short time. In the embodiment of FIG. 8 the flip-flop circuits and the gate circuits cooperate to adjust a plurality of values at the same time and to correct the erroneous values adjusted. If the flip-flop circuits and the gate circuits are controlled in digital fashion, a microcomputer or the like may be used to achieve such an adjusting step as accomplished by the embodiment of FIG. 8. If a microcomputer is employed, more values can be adjusted at the same time.

As mentioned above, it is possible with this invention to automatically adjust various parts of an electric circuit at the same time by operating the parts simultaneously. The invention can therefore adjust the electrical characteristics of an electric circuit in an extremely short time and with a high precision.

Industrial Applicability

An apparatus for driving pulse motors of an automatic testing apparatus according to this invention can be effectively worked in a factory which manufactures on a large scale printed circuit boards with many electric circuits formed. The apparatus can adjust many printed circuit boards quickly. The printed circuit boards thus adjusted can contribute to production of television receivers and transmitters of good quality.

We claim:

1. An apparatus for driving pulse motors for automatically adjusting external circuits comprising:
 a plurality of rotation direction switching circuits each having a first control terminal and a second control terminal;

pulse motor means including a plurality of pulse motors connected to the respective rotation direction switching circuits and a plurality of driven devices connected to the respective pulse motors for adjusting said external circuits, each of said pulse motors rotating in one direction when a control signal is supplied to said first control terminal of the corresponding rotation direction switching circuit and rotating in the reverse direction when said control signal is supplied to said second control terminal of the corresponding rotation direction switching circuit;

measuring means adapted to be connected to said external circuits for measuring the outputs of said external circuits;

a plurality of digital comparators connected to said measuring means, for comparing output data of the measuring means with predetermined data and for delivering logic outputs through first output terminals thereof when the output data of the measuring means is greater than the predetermined data, through second output terminals thereof when the output data of the measuring means is smaller than the predetermined data and through third output terminals thereof when the output data of the measuring means is substantially equal to the predetermined data, said first output terminals connected to the respective first control terminals and said second output terminals connected to the respective second control terminals;

a pulse generating circuit for generating drive pulses to drive said pulse motors;

gate circuit means connected to said pulse generating circuit and the digital comparators, for individually inhibiting said drive pulses from being supplied to the pulse motors when receiving predetermined logic outputs from the third output terminals; and control circuit means connected to the said gate circuit means for outputting a stop signal when receiving the predetermined logic outputs from the third output terminals so as to turn off the gate circuit means, whereby automatic adjustment of said external circuits is stopped.

2. The apparatus according to claim 1, wherein said external circuits are a horizontal oscillation circuit, a vertical output circuit and a power source circuit of a television circuit, and said measuring means is a digital frequency counter, a first digital voltmeter and a second digital voltmeter.

3. The apparatus according to claim 1, wherein said control circuit means comprises a plurality of flip-flop circuits each having a set output terminal and said gate circuit means comprises a first group of AND circuits connected at first input terminals thereof to the respective third output terminals and connected at second input terminals thereof to an output terminal of said pusle generating circuit and a second group of AND circuits connected at first input terminals thereof to output terminals of the respective AND circuit of the first group and connected at second input terminals thereof to the set output terminals of the flip-flop circuits, respectively.

4. The apparatus according to claim 1, wherein said control circuit means comprises a first AND circuit with three input terminals connected to the third output terminals, respectively, a plurality of flip-flop circuits each having a reset terminal connected to an output terminal of the first AND circuit and a plurality of second and circuits connected at first input terminals thereof to set output terminals of the flip-flop circuits, respectively, said second AND circuits receiving at second input terminals thereof pulses for driving respective pulse motors.

5. The apparatus according to claim 1, wherein each of said driver devices comprises a tip having a pointed end to be fitted in the part of the corresponding external circuit; a groove formed in the outer periphery of a proximal protion of the tip and extending in the axial direction of the tip; a tip holding rod having an axial hole into which the proximal end portion of the tip is inserted to compress a spring, a flange-like stopper formed at a distal end portion of said tip holding rod where the axial hole opens, and a hole made at a proper distance from the stopper and communicating with the axial hole for receiving a steel ball; a steel ball having such a diameter that the steel ball passes through said hole, contacts the bottom of said groove of the tip and has the surface thereof partly flush with the outer periphery of the tip holding rod; a hollow cylinder surrounding the outer periphery of said tip holding rod, stopped at one end by said stopper, having a large inner diameter at a portion thereof which lies between said stopper and the hole to form a space for receiving the steel ball as long as said hollow cylinder is stopped by said stopper, and having an inner diameter at the remaining portion thereof which is substantially equal to the outer diameter of said tip holding rod; a compression spring for urging said hollow cylinder toward the stopper; a flexible joint attached at a distal end coaxially to the proximal end of said tip holding rod; a connection rod connected at a distal end coaxially to the proximal end of the flexible joint and supported by a pallet which is movable in the axial direction of the connection rod; a flexible shaft coupled at a distal end thereof to the connection rod and having a length corresponding to the distance for which said pallet may move; a clutch mechanism attached at one end thereof to the proximal end of the flexible shaft a spline shaft attached at one end thereof to the other end of the clutch mechanism; a spline metal having a hollow of such a shape that said spline metal mates with the outer periphery of the spline shaft, permits the spline shaft to move in the axial direction thereof and rotates when the spline shaft rotates; first drive means for rotaring the spline metal; bearing means for supporting the spline metal; a recoil spring; and second drive means for pushing the spline shaft in the axial direction of the spline metal toward the flexible shaft through the recoil spring.

* * * * *